United States Patent [19]

Yonezawa et al.

[11] 4,383,176
[45] May 10, 1983

[54] OBJECTIVE LENS FOR ELECTRON MICROSCOPE

[75] Inventors: Akira Yonezawa, Fussa; Kohei Shirota, Akikawa, both of Japan

[73] Assignee: International Precision Incorporated, Tokyo, Japan

[21] Appl. No.: 229,527

[22] Filed: Jan. 29, 1981

[30] Foreign Application Priority Data

Jan. 30, 1980 [JP] Japan .................................. 55-8722

[51] Int. Cl.³ ............................................ H01J 29/64
[52] U.S. Cl. ......................................... 250/396 ML
[58] Field of Search ..................... 250/396 ML, 396 R

[56] References Cited

U.S. PATENT DOCUMENTS 3,585,546  6/1971  Yanaka et al. ............... 250/396 ML

FOREIGN PATENT DOCUMENTS 1238889  7/1971  United Kingdom .

OTHER PUBLICATIONS

A 100 KV Transmission Electron Microscope With Single Field Condenser Objective, W. D. Riecke, E. Ruska – Sixth International Congress for Electron Microscopy, Kyoto (1966), p. 19.

Objective Lens Properties of Very High Excitation S. Suzuki, K. Akashi and H. Tochigi 1968 Twenty-Sixth Annual EMSA Meeting.

Primary Examiner—Alfred E. Smith
Assistant Examiner—Carolyn E. Fields
Attorney, Agent, or Firm—Lane, Aitken & Kananen

[57] ABSTRACT

A symmetrical magnetic field type objective lens for an electron microscope comprises an upper magnetic pole piece and a lower magnetic pole piece disposed below the upper pole piece with a predetermined inter-pole distance S. Bores of a same diameter b are formed in the upper and the lower pole pieces, respectively. The distance S and the diameter are selected so that $1 \leq S/b \leq 5$. Additionally, excitation J of the objective lens is so selected with respect to a predetermined magnetomotive force Jc.o. of a Riecke-Ruska's condenser objective lens that the condition that $1.4 \, Jc.o. \leq J \leq 1.7 \, Jc.o.$ is fulfilled. The objective lens assures a wide field of view without being accompanied with blurs or distortion of image.

1 Claim, 9 Drawing Figures

OBJECTIVE LENS FOR ELECTRON MICROSCOPE

BACKGROUND OF THE INVENTION

1. Field of the Invention

The present invention relates to an improvement of a symmetrical magnetic field type objective lens destined for use in an electron microscope.

2. Description of the Prior Art

In general, a spherical aberration coefficient ($C_s$) and a chromatic aberration coefficient ($C_c$) provide important factors in determination of performance of the objective lens for the electron microscope. The objective lens which suffers such aberrations to lesser degree is considered to exhibit an improved performance. Further, in order to realize an objective lens having a satisfactory performance for the electron microscope, it is required that a wide field of view can be obtained and that neither blurs nor distortions occur in a peripheral portion of the field of view. There has hitherto been known no objective lenses for the microscope which satisfy the requirements described above, presenting problems that the various aberrations of the objective lens make appearance noticeably and/or difficulty is encountered in attaining a wide field of view, particularly when image of a specimen is observed with a small magnification.

As an attempt to reduce the adverse influences ascribable to the spherical aberration and the chromatic aberration, there is already known an objective lens which is referred to as Riecke - Ruska's condenser objective lens and in which the aberration coefficients described above are reduced by increasing magnetic excitation for the objective lens. Hereinafter, the magnetomotive force of the Riecke-Ruska's condenser objective lens will be represented by Jc. o. Since this condenser objective lens is also of a symmetrical magnetic field type, apertures formed in an upper magnetic pole piece and a lower magnetic pole piece are imparted with a same diameter, wherein a specimen to be observed is positioned at a middle point between the upper and the lower magnetic pole pieces, as will be described hereinafter in more detail in conjunction with FIG. 1 of the accompanying drawings. However, because more intensive excitation is effected for a magnetic field at the side of a condenser lens than at the location of a specimen in the case of the electron microscope incorporating the condenser objective lens, resulting in a correspondingly intensified convergence of the electron beam through the excitation, difficulty is encountered in the control of the illuminating electron beam. Further, it is difficult to attain a wide field of view in the observation with a small magnification, to a further disadvantage.

On the other hand, in the case of a conventional electron microscope in which no use is made of the condenser objective lens, the objective lens is excited with a smaller magnetomotive force than that (Jc. o.) of the condenser objective lens. As a result, the spherical aberration coefficient as well as the chromatic aberration coefficient tends to be increased to inconvenience. When the magnetomotive force is increased up to the level corresponding to Jc. o. in an effort to reduce these aberration coefficients, then there will arise a problem that an image of a high quality is difficult to be produced at a low magnification as in the case of the condenser objective lens.

As the objective lens having the magnetomotive force of a greater magnitude than the one corresponding to Jc.o., there is known Suzuki-Tochigi's S-zone lens. In the electron microscope using this lens, the specimen is disposed at a position lower than the middle or center point between the upper and the lower magnetic pole pieces. The electron flux incident in parallel onto the objective lens is once converged previously and impinges on the specimen in parallel. With the S-zone lens, it is certainly possible to reduce the aberration coefficients more than the condenser objective lens, so far as the excitation of the magnetic pole pieces remains unsaturated, while the irradiating electron beam can be controlled easily as is in the case of the objective lens whose magnetomotive force is smaller than that of the condenser objective lens. However, difficulty is also involved in the observation with a low magnification in respect that the field of view is in practice decreased due to an objective aperture and/or remarkable distortion occurs in the produced image.

SUMMARY OF THE INVENTION

An object of the invention is therefore to eliminate the shortcomings of the hitherto known objective lens of the symmetrical magnetic field type for an electron microscope such as those described above.

Another object of the invention is to provide a symmetrical field type objective lens for an electron microscope which lens exhibits decreased aberration coefficients and is capable of suppressing distortions and blurs in a produced image to minimum without being subjected to reduction in the field of view due to the objective aperture even in an observation with a low magnification.

In view of above and other objects which will become more apparent as description proceeds, there is proposed according to an aspect of the invention a symmetrical field type objective lens of an electron microscope which is of a rotationally symmetric configuration relative to an optical axis of a magnetic field type electron lens system and comprises an upper magnetic pole piece and a lower magnetic pole piece disposed with a distance therebetween, and bores of a same diameter which are formed in the upper and the lower magnetic pole pieces, respectively. When the distance between the upper and the lower magnetic pole pieces is represented by S while the diameter of the bores is represented by b, these dimensions S and b are so selected that the following relation is fulfilled.

$$1 \leq S/b \leq 5$$

Additionally, it is proposed that when excitation energy for the objective lens is represented by J while a magnetomotive force of Riecke-Ruska's condenser objective lens at which an electron beam incident on the objective lens in parallel with the optical axis will once intersect the optical axis and leaves the objective lens in parallel with the optical axis is represented by Jc.o., the following relation should apply valid for a given value of S/b in the range defined above. That is, $$1.4 \, Jc.o. \leq J \leq 1.7 \, Jc. \, o$$

Other objects, features and advantages of the invention will be more apparent from the following description of preferred embodiments of the invention. The description makes reference to the accompanying drawings.

DETAILED DESCRIPTION OF THE PREFERRED EMBODIMENTS

Now, the invention will be described by way of example in conjunction with the drawings.

Figure 1:
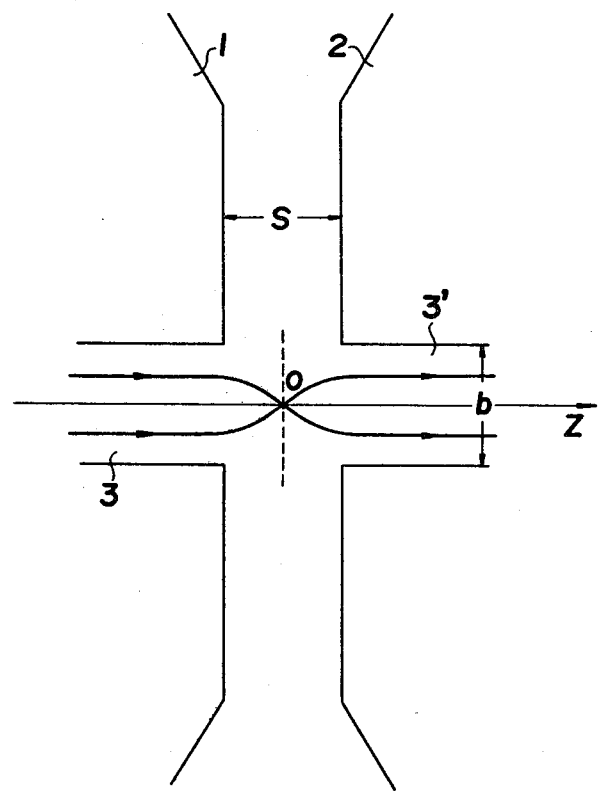
FIG. 1 illustrates schematically and by way of example a travel path of electrons in a symmetrical magnetic field type objective lens.

Referring to FIG. 1 which shows schematically an arrangement of a symmetrical field type objective lens for an electron microscope, the objective lens is composed of an upper magnetic pole piece 1 and a lower magnetic pole piece 2 disposed in opposition to the upper magnetic pole piece 1 with a predetermined distance therefrom. Apertures 3 and 3' are formed in the upper and the lower magnetic pole pieces 1 and 2, respectively, for allowing a flux of electrons or electron beams to pass therethrough. The centers of the apertures 3 and 3' coincide with an optical axis Z of the objective lens. A convergence point at which the electron beam passing through the objective lens is focused, inclination of the electron beam irradiating a specimen and aberration coefficients can be determined on the basis of the inter-pole distance S between the upper and the lower magnetic pole pieces, diameter b of the bores 3 and 3' and a magnetomotive force J applied between the upper and the lower magnetic pole pieces.

In general, when distribution of the magnetic field along the optical axis (or Z-axis) in a lens of a rotationally symmetric magnetic field type is represented by Bz(Z), then the axis neighborhood (or near-axis) path of electron can be obtained as a solution of the following equation, provided that rotation of electron around the axis is not taken into consideration. That is, $$\frac{d^2y}{dz^2} + \frac{eBz^2(Z)}{8m_oU^*} y(Z) = 0 \tag{1}$$

where e represents electric charge on an electron, $m_o$ represents mass of an electron and $U^*$ represents an accelerating voltage corrected on the basis of the relativity theory. For particulars, reference is to be made to a literature "Grundlagen der Elektroenoptik" of W. Glasser.

In the case of the lens of a so-called symmetrical magnetic field type in which the diameters b of the bores 3 and 3' formed in the upper and the lower magnetic pole pieces 1 and 2, respectively, are identical with each other, the field distribution Bz(Z) in the above equation (1) is determined in accordance with the following expression, provided that the magnetic pole pieces 1 and 2 as well as a yoke are not excited to a saturated state. That is, $$Bz(z) = \frac{2\mu_o J}{\pi S} \int_0^\infty \frac{\sin\left(\frac{S}{b}t\right)\cos\left(\frac{2tz}{b}\right)}{tI_o(t)} dt \tag{2}$$

where $\mu_o$ represents the permeability of vacuum and $I_o(e)$ represents a modified Bessel function where the origin O of the associated coordinate is taken at a middle point between the upper and the lower magnetic pole pieces. From these equations, the travel path of electron can be determined.

The spherical aberration coefficient $C_s$ and the chromatic aberration coefficient $C_c$ can be determined on the basis of the following expressions (3) and (4), respectively.

$$C_s = \frac{e}{128m_oU^*} \int_{Z_0}^{Z_1} \left( \frac{3e}{m_oU^*} B_z^4 + 8B'_z{}^2 \right) y^4 - 8B_z^2 y'^2 y^2 dz \tag{3}$$

$$C_c = -\frac{e}{8m_oU^*} \int_{Z_0}^{Z_1} B_z^2 y^2 dz \tag{4}$$

where $Z_o$ represents the position of the specimen, and $Z_1$ represents the position of an image plane.

Figure 2:
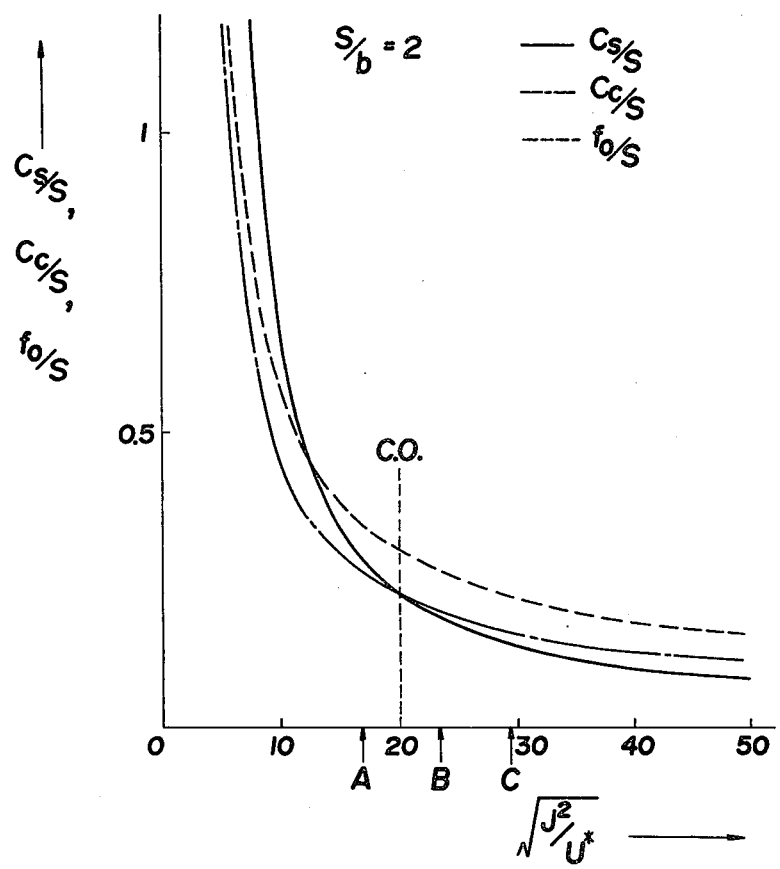
FIG. 2 illustrates graphically changes of a spherical aberration coefficient ($C_s/S$), a chromatic aberration coefficient ($C_c/S$) and a focal length ($f_o/S$) as a function of excitation ($\sqrt{J^2/U^*}$) of an objective lens on the assumption that S/b is equal to 2.

For the case where S/b is set equal to 2 and the image of a specimen is focused at a point at infinity (i.e. $Z_1 = \infty$) through the objective lens, FIG. 2 graphically illustrates variations in the ratios between the spherical aberration coefficient Cs and the inter-pole distance S, between the chromatic aberration coefficient Cc and the inter-pole distance S and between the focal length $f_o$ and the inter-pole distance S in dependence on the intensity of excitation of the objective lens, i.e. $\sqrt{J^2/U^*}$. It can be seen from this figure that the aberration coefficients Cs and Cc as well as the local length $f_o$ vary in dependence on the excitation of the objective lens on the assumption that the inter-pole distance S (i.e. the distance between the upper and the lower magnetic pole pieces 1 and 2) is constant. Further, it is clear from FIG. 2 that the spherical aberration coefficient Cs, the chromatic aberration coefficient and the focal length are decreased, as the objective lens is excited more intensively. The condenser objective lens described hereinbefore is used at the intensity of excitation $\sqrt{J^2/U^*}$ of the order of 20 AT/V$^{\frac{1}{2}}$ (Ampereturn-/$\sqrt{}$Voltage), as is indicated by a broken line C.O. in FIG. 2.

Figure 3A:
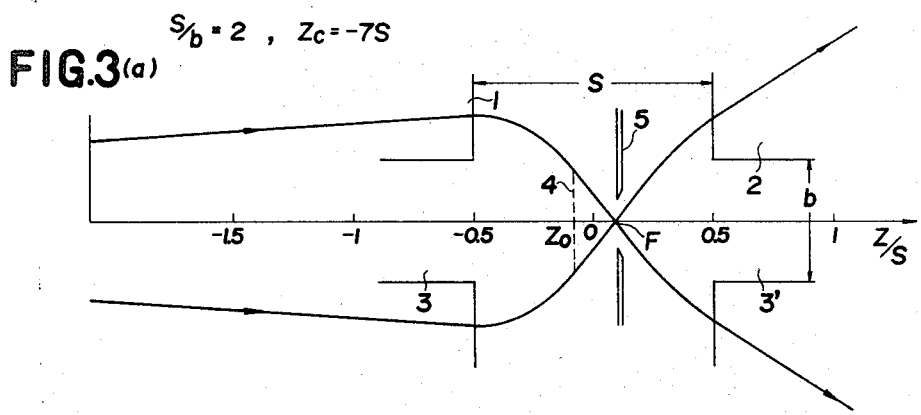
FIGS. 3(a), 3(b) and 3(c) illustrate schematically paths of the electron beam and convergence points of the electron beam at a position downstream of a specimen on conditions that S/b is equal to 2 and that the objective lens excitation ($\sqrt{J^2/U^*}$) is selected equal to 17 AT/V$^{\frac{1}{2}}$, 23 AT/V$^{\frac{1}{2}}$ and 29.4 AT/V$^{\frac{1}{2}}$, respectively.
Figure 3B:
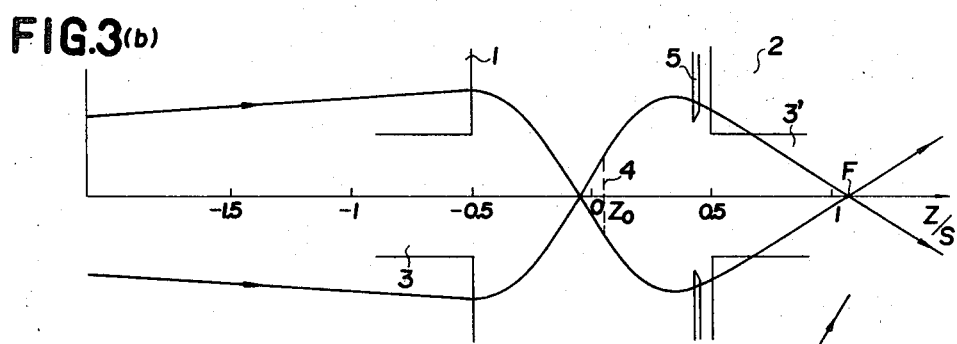
Figure 3C:
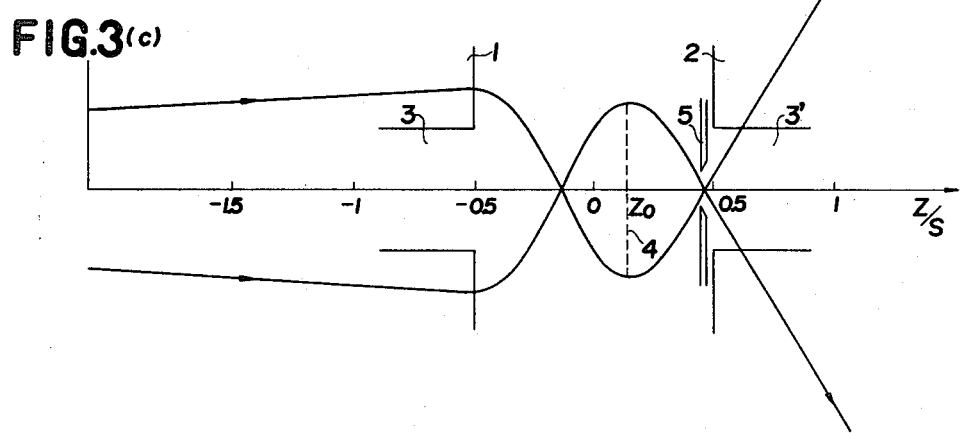

Three typical values A, B and C of the intensity of excitation are selected to be equal to 17 AT/V$^{\frac{1}{2}}$, 23 AT/V$^{\frac{1}{2}}$ and 29.4 AT/V$^{\frac{1}{2}}$, respectively, in FIG. 2, and the paths of the illuminating electron beam and the positions $Z_o$ of the specimen 4 corresponding to these excitation values are illustrated in FIGS. 3(a), 3(b) and 3(c), respectively. In each of these figures, a cross-over point produced by the condenser lens in front of the objective lens (upstream of the objective lens) is set at a position nearer to the convergence lens (or condenser lens) than to the center O of the objective lens, i.e. at the position Zc which is equal to −7S. Further, in FIGS. 3(a), 3(b) and 3(c), a convergence point at which the electron beam is focused is designated by a reference letter F. It will be appreciated that when an objective aperture 5 is disposed at the position corresponding to the convergence point F, the electron beam is not intercepted by the aperture 5, involving no reduction of the field of view. The path of the electron beam for the excitation intensity A is depicted in FIG. 3(a). As can be seen from this figure, there will arise various problems at the excitation level A. For example, because the distance between the specimen 4 and the convergence point F is as small as less than 0.2 S, disposition of the symmetrical aperture 5 at the convergence point F with a view to preventing the field of view from being narrowed will then result in that the specimen 4 is undesirably located so near to the aperture 5 that difficulty is encountered in tilting the specimen 4 in an attempt to vary the angle at which the specimen is observed. Besides, when the specimen 4 has to be disposed with a great inclination, the inter-pole distance S between the upper and the lower magnetic pole pieces 1 and 2 must be correspondingly enlarged, involving the correspondingly increased aberration coefficients to a disadvantage.

FIG. 3(b) illustrates the travel path of the illuminating electron beam at the excitation intensity B of 23 AT/V$^{\frac{1}{2}}$. In this case, the convergence point F lies at a position which is far beyond the inter-pole space between the pole pieces 1 and 2 and the convergence of the electron beam takes place within the bore 3. Under these conditions, it is extremely difficult to insert the objective aperture 5 at an appropriate position. When the objective aperture is disposed between the pole pieces 1 and 2, as shown in FIG. 3(b), the field of view of the objective lens will be narrowed by reducing the diameter of the aperture in a proportional relation. Further, even a slight change in the excitation of the objective lens will bring about disadvantageously a large variation in the position of the convergence point F.

In contrast to the excitation at the levels A (i.e. 17 AT/V$^{\frac{1}{2}}$) and B (i.e. 23 AT/V$^{\frac{1}{2}}$), the excitation at the level C of 29.4 AT/V$^{\frac{1}{2}}$ permits the path of the electron beam or flux to extend in such a manner as shown in FIG. 3(c). As can be seen from this figure, the convergence point F of the electron beam lies above the top plane of the lower magnetic pole piece 2 with a small distance therefrom, while a large distance (usually greater than 0.3 S) can be attained between the convergence point F and the specimen 4. Thus, not only the insertion of the aperture 5 in the objective lens is facilitated, but also the specimen can be tilted in a desired manner, allowing observation to be effected with a desired angular position of the specimen in a wide range of the inclination angles.

As will be appreciated from the foregoing discussion, when the position Zc of the cross-over point produced by the condenser lens lies at −7S where sign (−) represents that the cross-over point is positioned at the side of the convergence lens relative to the center point O of the objective lens, the excitation of the objective lens at the level C defined above can assure the most satisfactory irradiation electron beam for the specimen which is disposed between the upper and the lower magnetic pole pieces 1 and 2. It will be readily understood that when the position Zc of the cross-over point is changed by varying the excitation of the condenser lens, the position of the convergence point F (this position is represented by $Z_F$) of the irradiation electron beam in succession to the specimen position Zo is correspondingly varied. In this connection, it should be noted that the reference symbol Zc represents the position of the cross-over point produced by the condenser lens on condition that the excitation of the objective lens is zero.

Figure 4:
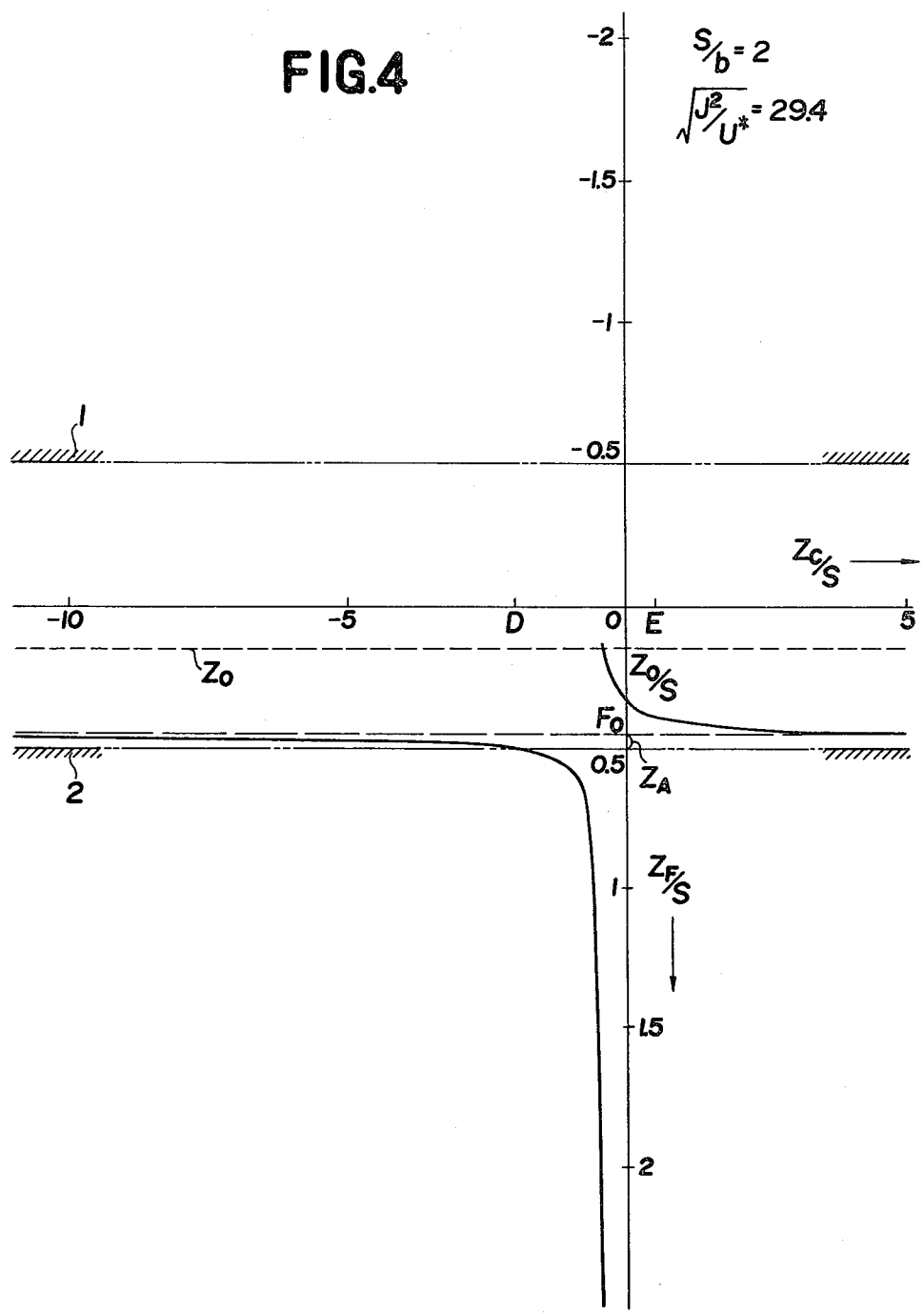
FIG. 4 illustrates graphically variations in position ($Z_F/S$) of the convergence point (F) of the electron beam relative to a position (Zc/S) at the side downstream of the specimen as a function of variation in the focus of a convergence lens on conditions that S/b is equal to 2 and that excitation of the objective lens is maintained at 29.4 AT/V$^{\frac{1}{2}}$.

FIG. 4 graphically illustrates a relationship between the ratios Zc/S and $Z_F$/S at the excitation level of 29.4 AT/V$^{\frac{1}{2}}$ of the objective lens on condition that the ratio S/b is set equal to 2. In this figure, the original of the illustrated coordinate corresponds to the middle point between the upper and the lower magnetic pole pieces of the objective lens. The ratio of the position of the cross-over point Zc to the inter-pole distance (i.e. Zc/S) is taken along the abscissa, while the ratio of the position $Z_F$ of the convergence point F of the irradiation electron beam to the inter-pole distance S (i.e. $Z_F$/S) is taken along the ordinate in which the direction of the optical axis is assumed to be positive. As can be seen from the graph shown in FIG. 4, the convergence point F is positioned in the vicinity of the top surface of the lower magnetic pole piece 2 (i.e. $Z_F/S \approx 0.5$) to provide satisfactory condition for observation of the specimen, provided that the ratio Zc/S is outside the range defined between points denoted by letters D and E in FIG. 4, i.e. unless $-2 \leq Zc \leq 0.5$.

A broken line representing that $Z_F/S = F_o$ and extending in parallel with the abscissa is an asymptote of the convergence point or focus F and indicates the point at which the electron beam incident on the objective lens in parallel with the optical axis (i.e. Zc/S = ∞) intersects the optical axis after having passed through the specimen. As can be seen from FIG. 4, the convergence point F is displaced to infinity when $-1 < Zc/S < 0$. Under the condition, it is difficult to dispose the objective aperture 5 at the convergence point F. However, when the excitation of the objective lens is maintained at 29.4 AT/V$^{\frac{1}{2}}$ even if the position Zc of the cross-over point produced by the condenser lens falls within the range defined above, the irradiation electron beam is extremely reduced in diameter smaller than that of the iris aperture (smaller than about 10μ) at the objective lens and can be transmitted through the bore 3 of the lower magnetic pole piece 2. Accordingly, it is not required to dispose the objective aperture 5 at the position of the convergence point F of the irradiation electron beam. The aperture 5 can be located at any given position between the upper and the lower magnetic pole pieces 1 and 2. It will now be understood that when the objective lens is disposed at the position corresponding to $Z_F/S=Fo$ (slightly above the top surface of the lower magnetic pole piece), the field of view will not be narrowed by the objective aperture over the substantially whole range of the variable Zc. The disposition of the objective aperture 5 near the top plane of the lower magnetic pole piece 2 allows the distance between the specimen 4 and the aperture 5 to be relatively great, whereby the specimen may be tilted at a relatively great angle. Further, the distance S between the upper and the lower magnetic pole pieces 1 and 2 can be reduced, while the aberration coefficients are made smaller.

When the distance between the lower magnetic pole piece 2 and the objective aperture 5 is represented by $Z_A$, this distance is given by the following expression:

$$Z_A = 0.5\ S - Fo$$

Figure 5:
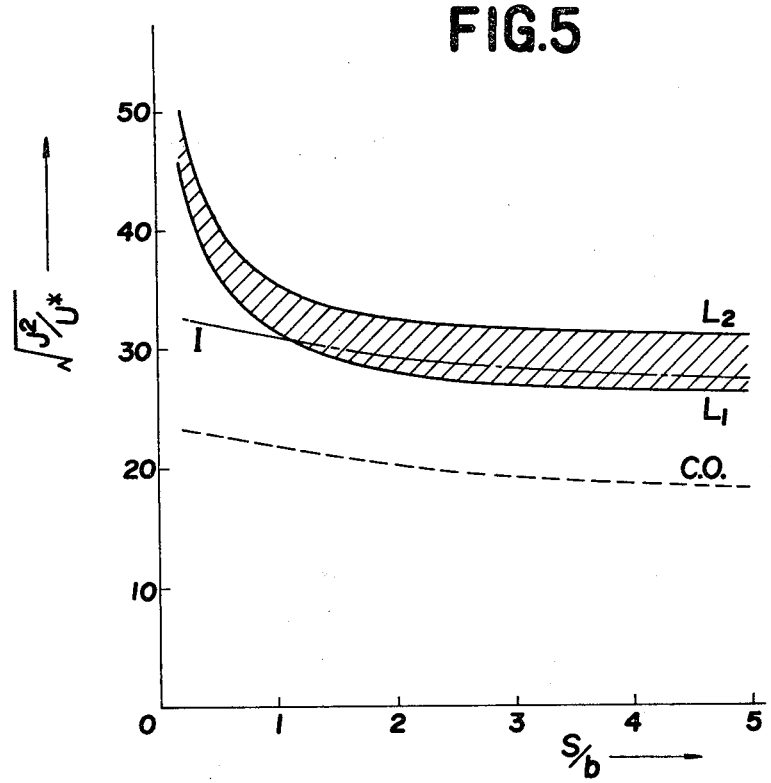
FIG. 5 illustrates graphically relationships between the ratio S/b and a range of excitation of an objective lens in which position (Fo) of an objective lens bores may be established in the vicinity of a top surface of the lower magnetic pole piece, a corresponding excitation curve for a condenser objective lens and the excitation of the objective lens through which the electron beam running in parallel with the optical axis may impinge onto the specimen.

A range of the excitation of the objective lens $\sqrt{J^2/U^*}$ in which the objective aperture 5 is allowed to be disposed in the vicinity of the lower magnetic pole piece 2 without involving disadvantages or difficulties (more precisely, the condition that $0 \leq Z_A \leq 0.15\ S$ is satisfied) has been determined as a function of the ratio S/b and illustrated in FIG. 5 by a hatched area. In this figure, a curve $L_1$ represents a relation between the ratio S/b and the intensity of excitation of the objective lens which allows the aperture position Fo to coincide with the top face of the lower magnetic pole piece 2 (i.e. $Z_A=0$). A curve $L_2$ represents a relation between the ratio S/b and the intensity of excitation of the objective lens which satisfies the condition that $Z_A=0.15\ S$. It will be also seen from FIG. 5 that the excitation in the range beyond the curve $L_2$ results in that $Z_A > 0.15\ S$, which means in view of the graph shown in FIG. 4 that the distance between the specimen and the aperture position Fo becomes smaller than 0.2 S. Consequently, the advantage that the specimen 4 can be tilted at a relatively large angle will be lost. Accordingly, in order to assure an improved manipulatability together with the wide field of view, the relation between the excitation of the objective lens and the ratio S/b should be maintained within the range indicated by the hatched area in FIG. 5. By the way, a relation between the excitation Jc.o. of the condenser objective lens and the ratio S/b is indicated by a broken line C.O. in FIG. 5. When the excitation of the objective lens which falls within the hatched range in FIG. 5 and is symbolized merely by J is expressed with reference to the broken line C.O., the following relation applies valid on condition that $1 \leq S/b \leq 5$. That is, $$1.4\ Jc.o.\ \leq J \leq 1.7\ Jc.o.$$

In the region where $S/b < 1$, the rate of change in the slopes of the curves $L_1$ and $L_2$ are too great to be practical, and the condition for parallel illumination described below is not satisfied. Besides, remarkable blurs and distortions tend to be produced. For these reasons, the range of S/b smaller than 1 (one) is not considered.

Figure 6:
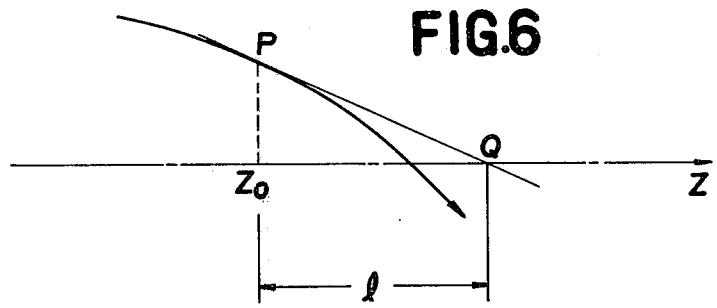
FIG. 6 illustrates a manner for determining inclination of the electron beam impinging on the specimen.

It is important for attaining the improved performance of the electron microscope that neither blur nor distortion of image is produced over the whole field of view. Referring again to FIG. 3(a) and (b), it will be seen that electron beam impinges with an inclination on the peripheral portion of the specimen which is located remotely from the optical axis Z (i.e. the electron beam does not impinge on the specimen perpendicularly there-to at the peripheral portion) with the excitations illustrated in these figures. Referring to FIG. 6, if a point at which the tangent of the path of electrons impinging on the specimen at a point P intersects the optical axis Z is represented by Q with a distance between the point Q and the position Zo of the specimen being represented by l, it is possible to estimate magnitude of the distortion and blur by determining the value of l/S. When the aberrations of magnetic field of the objective lens prevailing at the side of the condenser lens with respect to the specimen is neglected, the distance l is determined as a constant independently from the position of the point P. In general, when the value of l/S is small, i.e. inclination of the electron path to the specimen is large, then the blur and distortion become more noticeable, making it difficult to obtain a wide view field image of a high quality. On the other hand, the excitation described hereinbefore in conjunction with FIG. 3(c), electrons impinge on the specimen in the direction substantially perpendicular to the specimen. In this case, $l = \infty$, and $l/S = \infty$. This irradiation is termed "parallel illumination." With such parallel illumination, the blur and distortion can be suppressed to minimum. However, it is difficult to experimentally establish such irradiation. However, the condition for the parallel illumination can be mathematically determined in the manner described below.

Figure 7:
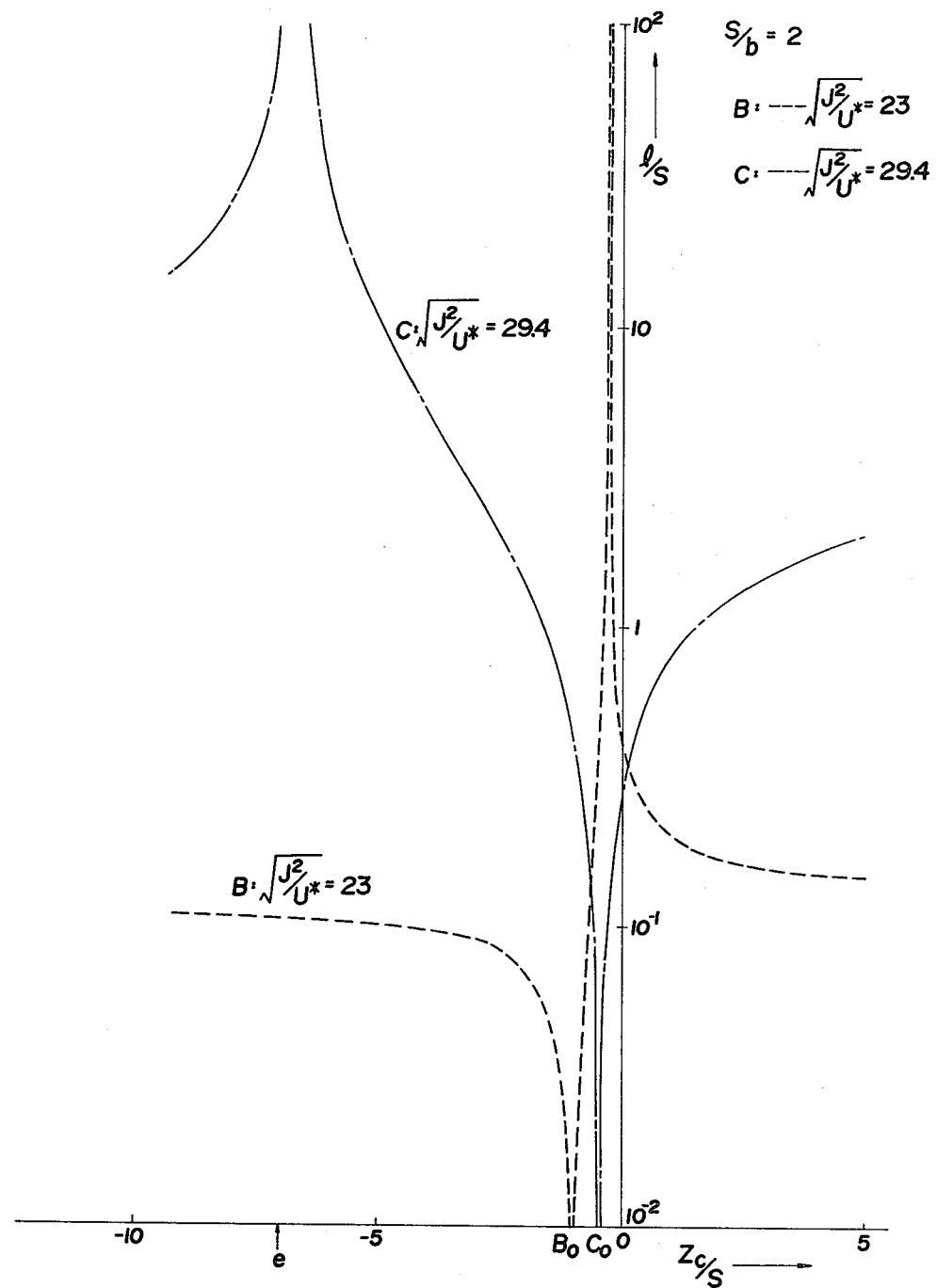
FIG. 7 illustrates in a semi-logarithmic graph the inclinations (I/S) of the electron beam impinging onto the specimen as a function of excitation (Zc/S) of the convergence lens on conditions that the ratio S/b is equal to 2 and that the excitation of the objective lens is maintained at 23 AT/V$^{\frac{1}{2}}$ and 29.4 AT/V$^{\frac{1}{2}}$, respectively.

Referring again to FIGS. 2 and 3, the values of l/S are determined as a function of Zc/S for the excitations at the levels B (23 AT/V$^{\frac{1}{2}}$) and C (29.4 AT/V$^{\frac{1}{2}}$). The results are graphically illustrated in FIG. 7. In this figure, a broken curve represents variation of l/S under the excitation at the level B, while a single-dotted broken curve represents the variation of l/S under the excitation at the level C. When an electron beam emitted from a spot-like electron source is focused at the position of the specimen 4 through the condenser lens, then l/S becomes equal to zero. Values of Zc/S in this case are indicated by Bo and Co in FIG. 7. In the excitation of the objective lens at the level B or C, the area of the specimen 4 irradiated by electrons can be varied by making the value of Zc/S variable by varying the excitation of the condenser lens. However, as can be seen from FIG. 7, l/S and hence l take significantly different values for the excitations at the intensity levels B (23 AT/V$^{\frac{1}{2}}$) and C (29.4 AT/V$^{\frac{1}{2}}$). Examination will be made on the example illustrated in FIGS. 3(a), 3(b) and 3(c). As described hereinbefore, paths of electrons as depicted therein are obtained through the condenser lens having the focus or convergence point at the position $-7\ S$. A value of Zc/S which meets the positional requirement mentioned just above is indicated by a reference character e in FIG. 7. The values of l/S at this abscissa point e are equal to $10^{-1}$ and $10^2$ under the excitations at the levels B and C, respectively. It can be seen that the irradiation under the excitation level C approximates far more to the so-called parallel illumination than the illumination under the excitation of magnitude B. In the region where the absolute value of Zc/S taken along the abscissa in FIG. 7 is large, the value of l/S under the excitation of magnitude C is increased by a factor of 10 to 100 as compared with the value of l/S under the excitation of magnitude B. Thus, it follows that the objective lens excited at the level C gives rise to the irradiation which approximates far more to the parallel illumination than at the excitation level B and assures a wider field of view of a high quality. On the other hand, in a region where $-0.3 \leq Zc/S \leq -0.2$, value of l/S becomes infinite even under the excitation of the intensity level B to permit the parallel illumination to be attained. In contrast, under the excitation of the intensity level C, the value of l/S becomes extremely small in the above region or around $-0.5$ of Zc/S. However, in the above region of the value of Zc/S, the irradiation electron beam is significantly reduced in diameter to a value smaller than the diameter of the aperture (to less than about $10\mu$) at the objective lens. Accordingly, distortion of image and/or reduction in the field of view will not be brought about through the excitation of the level C.

By the way, a relationship between the dimensional ratio S/b and the excitation $\sqrt{J^2/U^*}$ of the objective lens at which the electron beam running in parallel with the optical axis Z (i.e. $Zc/S = \infty$) is allowed to impinge on the specimen 4 in the direction perpendicular thereto (i.e. $l/S = \infty$) is indicated by a single-dotted broken line I in FIG. 5. In the region around the line I, large values of l/S can be obtained for a relatively large range in which the excitation of the condenser lens can be varied, whereby distortion of image is suppressed significantly.

It has been described hereinbefore that the range of the excitation of the objective lens which allows a wide field view to be attained without degrading the good manipulatability of the specimen 4 is indicated by the hatched area defined between the curves $L_1$ and $L_2$ and expressed as follows:

$$1.4 \text{ Jc.o.} \leq J \leq 1.7 \text{ Jc.o.}$$

provided that $1 \leq S/b \leq 5$.

Further, it will be appreciated that the range of the value of S/b in which the curve I described above is contained within the hatched region shown in FIG. 5 is given by the expression that $1 \leq S/b \leq 5$. Accordingly, it is clear that the ranges of the excitation of the objective lens symbolized by J and the dimensional ratio S/b in which a wider field of view can be obtained without being accompanied with any noticeable blurs and distortion in the produced image are defined by the expressions $1.4 \text{ Jc.o.} \leq J \leq 1.7 \text{ Jc.o.}$ and $1 \leq S/b \leq 5$, respectively.

It will be understood that the invention has now provided an objective lens for electron microscopes which allows the field of view to be enlarged, while reducing the distortion, and aberration coefficients to minimum, thereby to assure production of an image of a high quality.

Although the invention has been described in conjunction with the accompanying drawings, it will be appreciated that the invention is never restricted to the disclosure, but encompasses modifications and variations which will readily occur to those skilled in the art.

What is claimed is:

1. A symmetrical field type objective lens of an electron microscope which is of a rotationally symmetric configuration relative to an optical axis of a magnetic field type electron lens system and comprises an upper magnetic pole piece and a lower magnetic pole piece disposed with a predetermined distance therebetween, and bores of a same diameter which are formed in said upper and lower magnetic pole pieces, respectively, wherein said predetermined distance represented by S and said diameter of said bores represented by b are so selected that a relation given by the following expression $$1 \leq S/b \leq 5$$

is fulfilled, and wherein magnetic excitation for said objective lens represented by J is so selected with respect to a magnetomotive force of Riecke-Ruska's condenser objective lens represented by Jc.o. at which an electron beam incident on said objective lens in parallel with said optical axis once intersects said optical axis and leaves said objective lens in parallel with said optical axis that for a given value of S/b in the range defined above, the following condition $$1.4 \text{ Jc.o.} \leq J \leq 1.7 \text{ Jc.o.}$$

is fulfilled.

* * * * *